(12) United States Patent
Stelandre et al.

(10) Patent No.: US 8,330,713 B2
(45) Date of Patent: Dec. 11, 2012

(54) TOUCH-SENSITIVE DISPLAY DEVICE WITH AN INTEGRATED MECHANICAL OPERATING PART FOR MOTOR VEHICLES

(75) Inventors: Bertrand Stelandre, Thimister (BE); Thomas Sulzbach, Cologne (DE)

(73) Assignee: Visteon Global Technologies, Inc., Van Buren Township, MI (US)

( * ) Notice: Subject to any disclaimer, the term of this patent is extended or adjusted under 35 U.S.C. 154(b) by 707 days.

(21) Appl. No.: 12/504,169

(22) Filed: Jul. 16, 2009

(65) Prior Publication Data
US 2010/0020042 A1    Jan. 28, 2010

(30) Foreign Application Priority Data

Jul. 25, 2008  (DE) .......................... 10 2008 040 755

(51) Int. Cl.
  *G09G 3/34* (2006.01)
(52) U.S. Cl. ........ 345/111; 345/108; 345/184; 345/173; 178/18.01; 361/139; 463/37; 200/61.45 M
(58) Field of Classification Search .................. 345/173, 345/174, 108, 111, 184; 178/18.01, 18.06; 361/139, 600; 463/37; 200/61.45 M
See application file for complete search history.

(56) References Cited

U.S. PATENT DOCUMENTS

| | | | | |
|---|---|---|---|---|
| 2,310,543 A * | 2/1943 | Pearce | ............................. | 74/1 R |
| 3,160,737 A * | 12/1964 | Pearce | ..................... | 219/452.11 |
| 3,711,672 A * | 1/1973 | Moreland et al. | ............. | 219/625 |
| 4,158,216 A * | 6/1979 | Bigelow | ......................... | 200/600 |
| 4,317,016 A * | 2/1982 | Ito | .................................. | 219/622 |
| 4,983,812 A * | 1/1991 | Worrall et al. | ............. | 219/445.1 |
| 5,920,131 A * | 7/1999 | Platt et al. | ...................... | 307/104 |
| 6,498,326 B1 * | 12/2002 | Knappe | ......................... | 219/625 |
| 6,606,081 B1 * | 8/2003 | Jaeger et al. | ................... | 345/111 |
| 6,762,748 B2 * | 7/2004 | Maatta et al. | .................. | 345/157 |
| 7,404,471 B2 | 7/2008 | Felder et al. | | |
| 7,504,598 B2 * | 3/2009 | Weigold | ................. | 200/61.45 R |
| 7,642,886 B2 * | 1/2010 | Boss | ............................. | 335/205 |
| 2004/0201578 A1 | 10/2004 | Sadahiro | | |
| 2006/0095177 A1 * | 5/2006 | Donk et al. | ...................... | 701/36 |
| 2007/0057915 A1 * | 3/2007 | Yamauchi | ...................... | 345/156 |
| 2008/0029369 A1 * | 2/2008 | Weigold | ......................... | 200/17 R |
| 2008/0111428 A1 * | 5/2008 | Baier et al. | ...................... | 307/112 |
| 2009/0237370 A1 * | 9/2009 | Meier-Arendt et al. | ....... | 345/173 |
| 2010/0073288 A1 * | 3/2010 | Kramlich | ...................... | 345/157 |

FOREIGN PATENT DOCUMENTS

| | | |
|---|---|---|
| DE | 199 06 365 A1 | 8/2000 |
| DE | 100 35 592 A1 | 1/2002 |
| DE | 10 2005 034 957 A1 | 2/2007 |
| DE | 10 2006 043 208 A1 | 3/2008 |
| EP | 0 797 227 A2 | 9/1997 |
| EP | 9 962 707 A2 | 12/1999 |
| EP | 1 014 001 A2 | 6/2000 |

\* cited by examiner

*Primary Examiner* — Lun-Yi Lao
*Assistant Examiner* — Kelly B Hegarty
(74) *Attorney, Agent, or Firm* — Dickinson Wright PLLC

(57) ABSTRACT

The invention relates to a touch-sensitive display device with an integrated mechanical operating part for motor vehicles, in which a mechanical operating part (2) and a holding magnet (3) are provided. The operating part (2) is held by magnetic force on the surface of a touch-sensitive display device (1), whereby sensor elements (5) are provided under the surface of the display device (1), and that the switching positions of the operating part (2) can be determined by the sensor elements.

13 Claims, 4 Drawing Sheets

TOUCH-SENSITIVE DISPLAY DEVICE WITH AN INTEGRATED MECHANICAL OPERATING PART FOR MOTOR VEHICLES

CROSS REFERENCE TO RELATED APPLICATION

This application claims the benefit of German Patent Application No. 10 2008 040 755.0-34 filed Jul. 25, 2008, entitled "Touch-Sensitive Display Device With An Integrated Mechanical Operating Part For Motor Vehicles," the entire disclosure of this application being incorporated by reference.

BACKGROUND OF THE INVENTION

1. Technical Field

The invention relates to a touch-sensitive display device with an integrated mechanical operating part for motor vehicles.

2. Discussion

Devices of the type described above serve for combined display of functions and values of a device as well as simultaneous operation of them. They find application in electrical and electronic devices that in turn are integrated into motor vehicles or facilities. The touch-sensitive device, also designated as a touch screen or touch panel, makes possible registration of movements that are converted into meaningful control commands on one and the same as the display device. To induce the operator to touch the display device at the place provided, normally there appears the image of an operating part which the operator then touches. From this, touch screens allow universal possibilities for usage, easy adaptation to the required tasks and high-level dynamics of the functions provided. Large touch screens are becoming ever more convenient and indispensable; man-machine interfaces capable of adaptation are in demand, to implement ever more inputs and outputs of information.

The touch-sensitive display device includes a display device which usually is designed as a liquid crystal screen (LCD display), and a touch-sensitive element which can be based on various technical systems, usually based on capacitative or resistive surfaces.

In certain instances, the advantage of high-level universality of such touch-sensitive display devices and these flat surfaces ends up as a disadvantage. Primarily this is the case if a purely visually-based operation is not possible, and proper operation must at least partially involve the sense of touch, which is not possible on a flat display. If the device must be operated by people with limited or no vision, the device must be able to operate using only the sense of touch.

Such situations may also arise in motor vehicles, when visual attention is required to be devoted to the traffic situation, and operational manipulations must be carried out on palpable operating parts, with no need after some training or experience to look at them. Automotive technology generally requires special operating elements that are haptic and unrelated to sight to minimize visual requirements of devices. Especially important in this regard are shapes that allows the setting of the operating part to be perceived and provide perceptible feedback.

Operation by visually impaired persons of an elevator control unit was the problem that was to be solved in EP 1 598 298 A1 (U.S. Pat. No. 7,404,471). The problem was solved by equipping the touch-sensitive display device present on the on the elevator with one or more push buttons, which are attached to the surface of the display device and can also later be retrofitted. The operating parts are welded, glued, screwed or snapped onto the touch-sensitive display device. The also can be mounted on an adapter and prepared in grouping for attachment to the touch-sensitive display device on the elevator. A touch by the operator on the button is detected as a disturbance in an electromagnetic field, generated in the background of the touch-sensitive display device.

Touch-sensitive display devices also are used as an operating part or input device in motor vehicles. However, to operate the touch-sensitive display, the operator of the vehicle must look at the display device, which may during the operation of the vehicle involve reduced attention to the traffic situation. Therefore, the haptic operating possibility is advantageous, which, however, presupposes a relief shaping of the user surface or some other operating possibilities involving gripping or touching, not currently available on touch-sensitive displays.

U.S. 2004/0201578 A1 offers a solution for this that is designed in such a way that a covering is mounted over a touch-sensitive display device. This covering covers the screen fully or in part, is permanently installed, and is configured to be moved or detached. The covering accommodates an optional keyboard with buttons that can safely pushed without eye contact after appropriate experience in operation of the applicable device. The function is based on mechanical pressure being triggered by the operator and taken up the key, then acting on the touch-sensitive display device and triggering the appropriate control command. The corresponding reaction appears on the touch-sensitive display device, the touch screen, with only a section, a window, used for display. The type of cover is recognized and the incoming movements are correspondingly interpreted. In a further embodiment, the cover has holes by which, as a guide for the operating finger, the touch-sensitive display device is operated. The key assignments are variable and individually programmable, whereby in one embodiment, see-through keys are used in which the designation or a special color generated on the screen, shines through. Also, two or more keyboards can be placed on one screen.

With the arrangement from the above-named text, at the same time the requirement for a small footprint is met, which often represents an important goal when using touch-sensitive display devices. However, one disadvantage of this solution is that only the center position is specified if two buttons are pressed at the same time. Thus, the desired control command can be misinterpreted, if another button is in this center position.

The solutions provided make possible triggering of discrete switching states. However, what is a disadvantage in all known solutions is that no ranges of values can be gone through or analogous values set, and in addition, this setting cannot be done on a mechanical operating part at an unchanging location that the experienced operator can always safely reach. This requirement is especially fulfilled by rotatable operating parts.

It is true that the customary mechanical, and especially rotatable, operating parts need spaces enlarged in depth. Such installation depth can no longer be assured according to today's requirements, for example in automotive engineering. Therefore, use of touch-sensitive display devices offers the optimal state-of-the-art solution. As emphasized by their disadvantages, as described above, in terms of operability in moving motor vehicles, only pushbuttons or sliders are used as mechanical operating parts, as documented by the above material.

Therefore, the task that is the basis of the invention is to further develop a device according to the preamble of the invention that implements the haptic operation of mechanical operating parts in motor vehicles with minimum space required, and they are integrated into a touch-sensitive display device.

SUMMARY OF THE INVENTION

The problem is solved by a touch-sensitive display device with an integrated mechanical operating part or input device for motor vehicles in that the mechanical operating part is held by magnetic force on the surface of the display device, and the switching position is determined by sensor elements behind the display device. The mechanical operating part can be removed from the display device. The removable mechanical operating part assumes the safety function of a key. In additional advantageous embodiment forms, the mechanical operating part is configured as a push button, a rotary knob, a slider or as a short-stroke lever.

If the mechanical operating part is configured as a push button or as a rotary knob, the mechanical operating part may move automatically to pre-selected positions, and implements gestural display effects through movements. The mobility of the operating part is also advantageous for long, clear, ergonomical operating sequences on the surface of the touch-sensitive display device.

A similar solution in which a movable operating part is held on a surface by the force of a permanent magnet, is known, to be sure, but is used in the field of cooking, something foreign to the automotive engineer, to control cooking facilities with a cooking area manufactured from ceramic material, and not part of a touch-sensitive display. With this, a removable control device is held by magnetic force on the cooking area manufactured from ceramic material.

DE 199 06 365 A1 describes an operating device, for example for use in controlling a cooking area. Its running surface forms a running tip or is shaped to be lumpy.

EP 0 797 227 B1 makes claim to a device for controlling electrically driven devices. With this, the device for generation of a force field has at least one magnet held in a permanent position, or a magnet held so as to move. The operating part consists of an element made of ferromagnetic material that operates in concert with this magnet. Placement of the magnet held stationary, or of a support for the movably held magnet, defines the degrees-of-motion freedom. The device for fixing the position and/or alteration of the position of the operating part works in concert with the operating part in an exclusively touch-free manner. The operating part is held in a fixed position on the plate only by the force field.

Additionally, EP 0 962 707 B1 describes an operating unit for an electrical domestic device. In this case, it is an operating unit for setting of operating functions and parameters. In one advantageous embodiment, magnetic elements are assigned to an operating toggle switch and an operating surface, which hold the toggle movably on the operating surface.

Also, EP 1 014 001 B1 makes claim to a device for controlling electrically driven devices, especially electrical cooking devices, with at least one operating part placed on an outer side of a plate or able to be placed, a holding device assigned to the operating part for holding the operating part on the plate, and a sensor device provided to operate in concert with a control device, for detecting the position and/or change in position of the operating part. At least one operating part is configured as a slider that automatically returns to an idler position, which can be slid in at least one shift direction along the plate.

The task of the cooking devices is to keep the area very clean, in that the cooking device consists only of flat uninterrupted surfaces.

The cooking area manufactured from ceramic material is hard to process during manufacturing; there is a danger of breakage when drilling the opening for an operating part. This risk is reduced by the practiced solution.

BRIEF DESCRIPTION OF THE DRAWINGS

The present invention will become more fully understood from the detailed description given here below, the appended claims, and the accompanying drawings in which:

DETAILED DESCRIPTION OF THE PREFERRED EMBODIMENT

Figure 1:
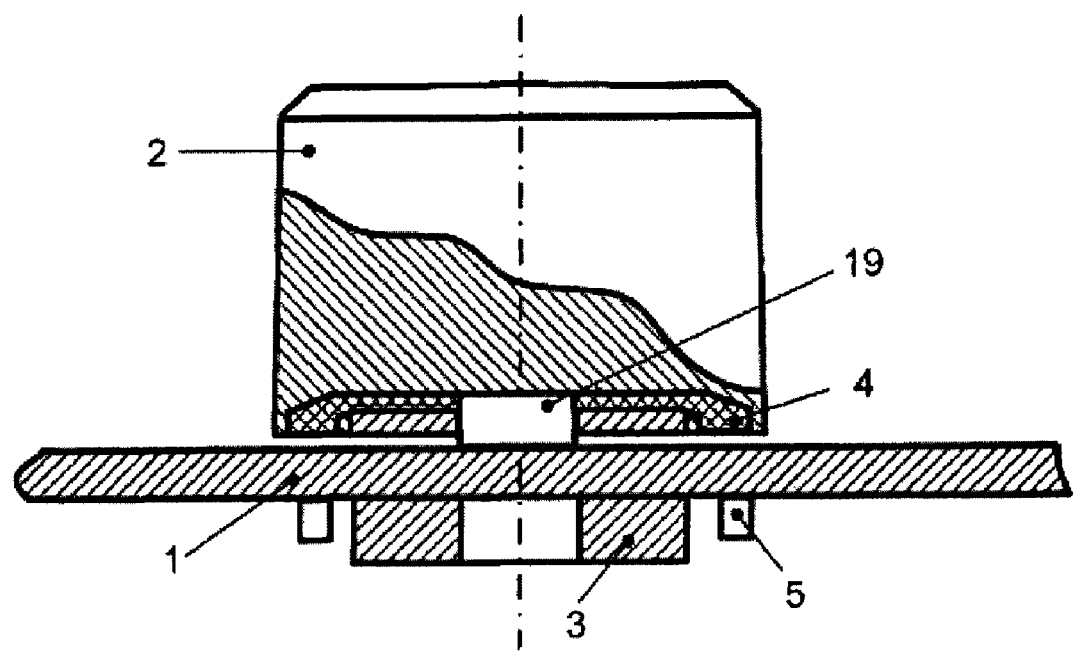
FIG. 1 shows an operating parts on the touch-sensitive display device.

FIG. 1 shows a mechanical operating part 2 that is held on a touch-sensitive display device 1 by a holding magnet 3, illustrated in FIG. 1 as being implemented using a permanent magnet. This succeeds via magnetic field lines running perpendicular to the surface of touch-sensitive display device 1 and a corresponding counter element on an operating part 2 which in an advantageous further development is implemented as a ferromagnetic element 4, manufactured from a ferromagnetic material. The axis of the magnetic field simultaneously forms the axis of rotation for a rotatable operating part 13. It may also be advantageous to use a permanent magnet with corresponding polarity.

In addition sensors 5 are recognized, which, in their method of operation, are configured according to the sensor influence and may react to magnetic influences if the sensor influence 6 functions on the basis of a magnetic field. In addition, this embodiment includes the advantage that a palpable feedback effect, a locking effect, appears when the operating part moves.

Figure 5:
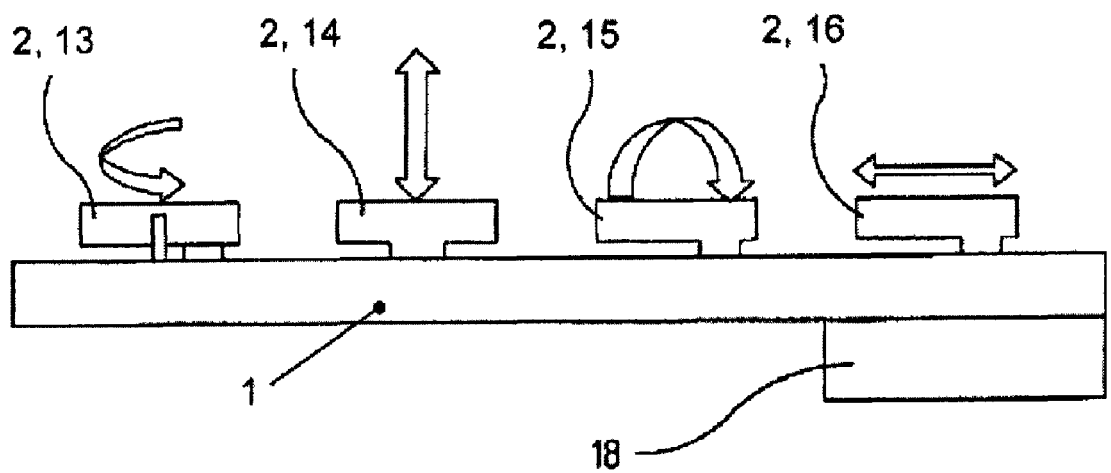
FIG. 5 shows a touch-sensitive display device in cross section.

With the aid of the illustrated arrows in FIG. 5, it can also be recognized that along with the turning motion, other operating motions, namely linear ones, are used, if the sensors 5 are configured for this in suitable fashion.

The holding magnet 3 may also be implemented as an electromagnet. This proves to be especially advantageous if weight reduction is significant vis-à-vis the energy required to supply the holding magnet 3.

A spacer element 19 may ensure the functional distance between touch-sensitive display device 1 and operating part 2 that is required especially for operating part 2 to rotate.

Figure 2:
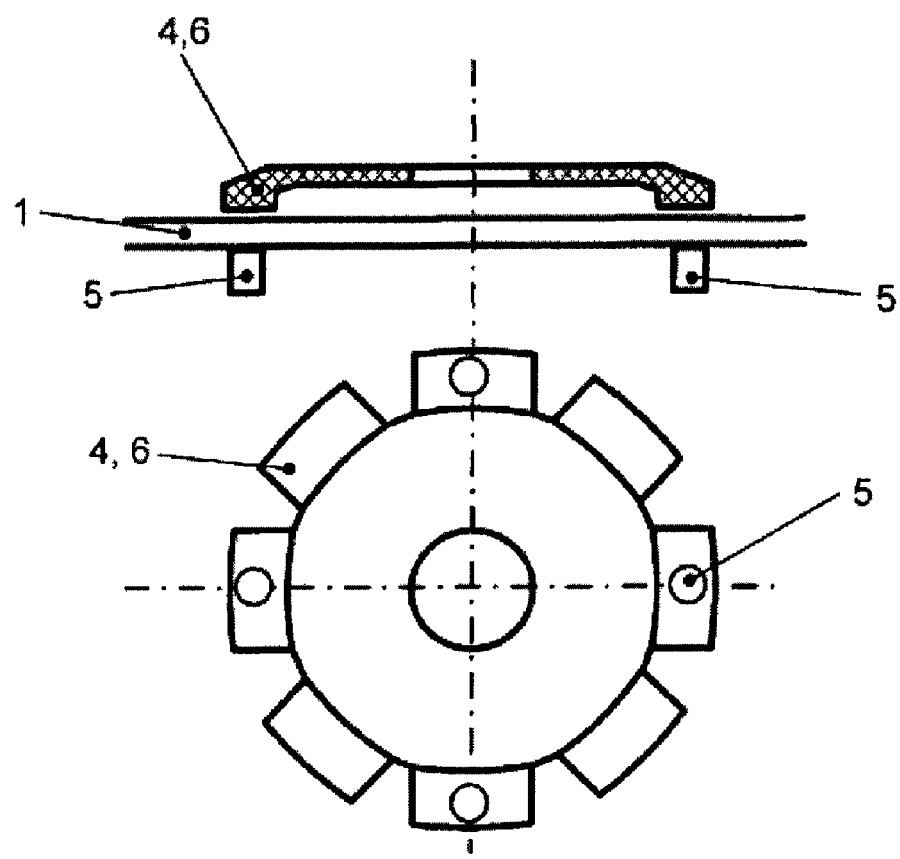
FIG. 2 shows permanent magnets and sensors on the operating part.

FIG. 2 makes clear the function of operating part 2 in connection with the touch-sensitive display device, especially for implementing a haptic feedback.

Depicted are the sensors 5 together with the sensor influence 6, which in this embodiment has two or more arms consisting of ferromagnetic material, and thus forming the ferromagnetic element 4. The sensors 5 are placed beneath the surface of touch-sensitive display device 1, the operating part 2 with the sensor influence 6 above. According to the progression of magnetic field lines and the influence of mutual interaction with the sensors 5, a palpable locking effect arises when operating part 2 is rotated, from which there results a haptic feedback effect of the operating process to the operator.

The locking effect arises through the bunching of magnetic field lines between sensor 5 and the arms of sensor influence 6.

Figure 7:
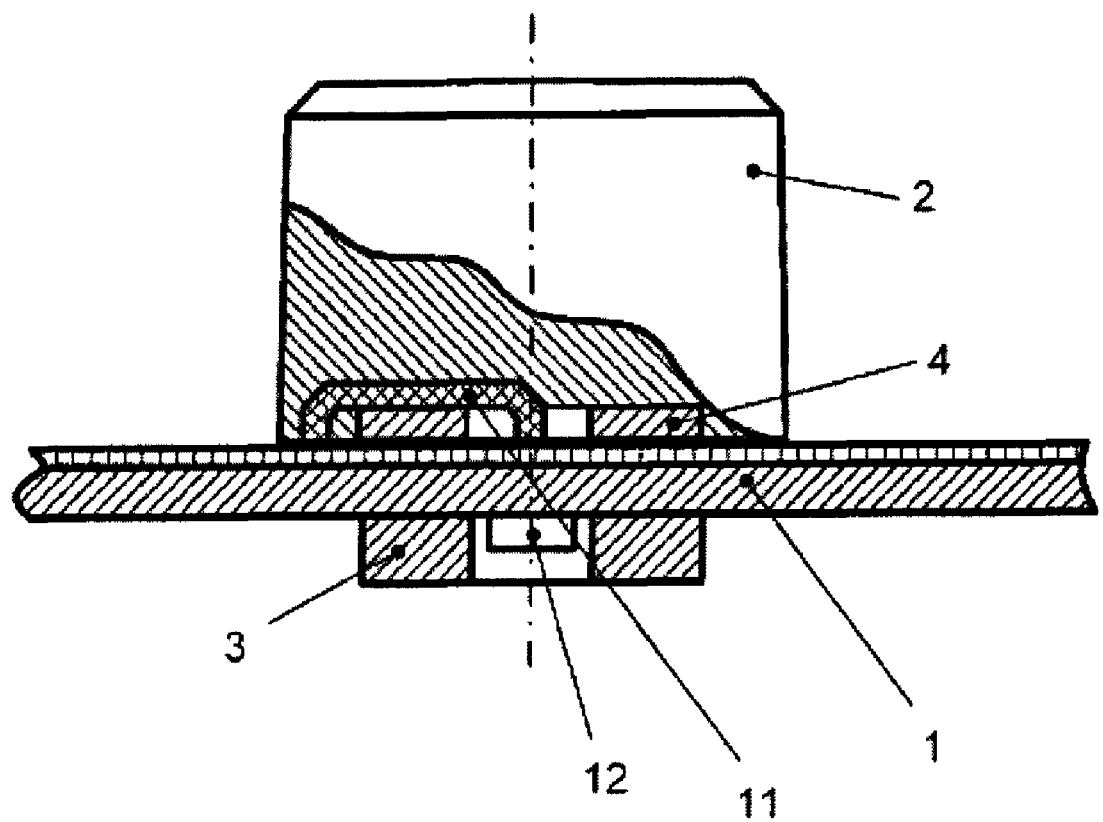
FIG. 7 shows an exemplary touch-sensitive display device.

In an advantageous further development, the sensors 5, which generate the switching signal for transmission on to the control device, register magnetic fields, which are also used for holding operating part 2 on touch-sensitive display device 1. Further exemplary forms are supported with generation by the operator's moving the operating part 2 of generated switching signals based on capacitative, inductive effects or of reflection effects as an interaction between sensor 5 and sensor influence 6. A special exemplary form of the last-named effect is shown in FIG. 7 and described in detail below.

An integrated assessment unit 18 may process the signals emitted by the sensors into clear operating pulses for the units to be operated.

FIG. 3 shows yet another exemplary feature of the invention. Here it is primarily the mobility of the operating parts that are not connected in form-locked fashion with the touch-sensitive display device, that come to bear in advantageous fashion. The magnetic support via magnet 3, placed on the underside of the touch-sensitive display device, is implemented in two axes in this embodiment. With this, the operating part is guided via the surface of the touch-sensitive display device 1 to the provided points. Therefore, with a single operating part, differing functions can be implemented, without the operating losing oversight of the current functional area and of the particular functions that can be influenced. In the example shown, a further touch-sensitive display device, the touch screen 7, serves for preselection of functional areas.

Toward the operating impulse on touch screen 7, the operating part 2 moves to the selected field and operation can be undertaken on the operating level placed after.

In a further development of this example, touch screen 7 can be provided with mechanical operating parts configured as push buttons 14. In a further advantageous form, the functional area, and the automatic motion following that of the operating part can be preselected based on voice commands, which replace the touch screen 7 in that case and assume its function.

A further advantageous form of the invention is based on the inverse functionality of mobile operating part 2. The movement of operating part 2 undertaken by the operator is registered by the drive 10 and interpreted as an operating action. This embodiment form makes the operating action very plastic and opens up a multiplicity of easily learned control sequences able to be read out on touch-sensitive display device 1.

Figures 3A, 3B:
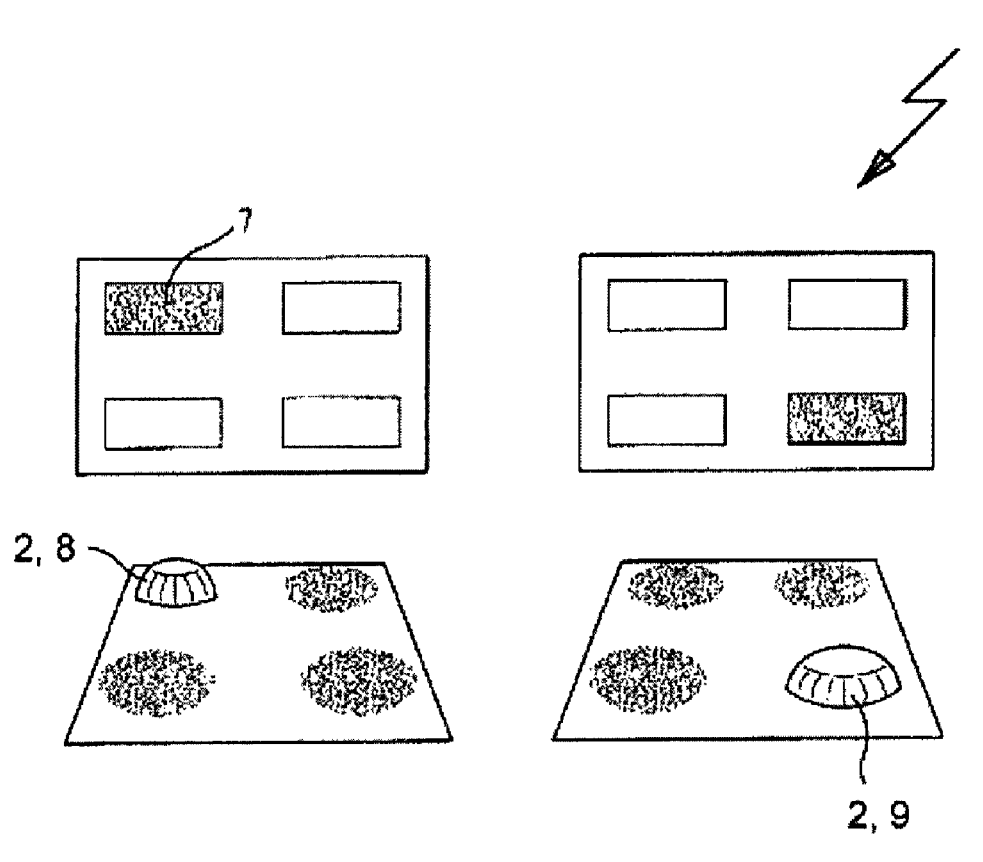
FIG. 3a shows an automatic motion of the operating parts in a first position.
FIG. 3b shows an automatic motion of the operating parts in a second position.

In FIG. 3a, the operating part is depicted in a first position 8 and in FIG. 3b in a second position 9 according to the described advantageous form of the invention.

Figure 4:
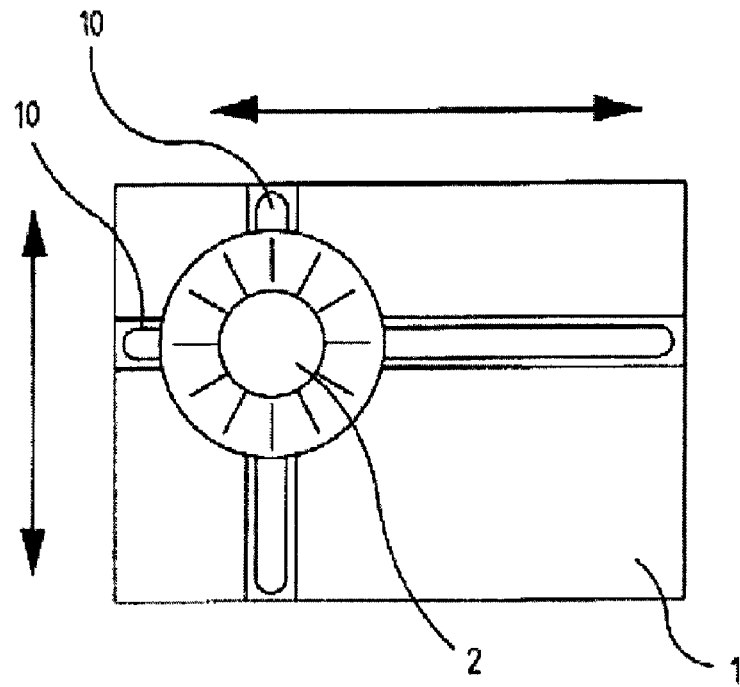
FIG. 4 shows a drive for the automatic motion of the operating parts.

FIG. 4 shows in detail the function of the mobile operating parts. On two drives 10 for automatic motion of operating part 2, placed at an angle of 90° to each other, magnet 3 which holds operating part 2, a permanent magnet in the example, moves to each point in the surface of touch-sensitive display device 1. More specifically, the operating part 2 moves on its surface, and generates, along with the advantages named previously, a surprising effect and unexpected result. Additionally, the mobile operating part 2 assumes display functions, in that for example a certain motion represents a specific switching state, or signals a change of operating plane that is visually, but also haptically, perceptible.

In an advantageous further development, according to the FIG. 5 depiction, the sensors 5 register not just rotating motions about the axis of, such as illustrated by operating part 13, but also linear shifts of some millimeters in the two axes, which run parallel to the position of touch-sensitive display device 1, such as illustrated by operating parts 14 and 16. A further mobility option of operating part 2 is tipping, and thus this is implemented such as by the illustrated operating part 15 that is capable of tipping. With this also, discrete switching statuses are present as with the version with push buttons 14. Owing to this, there are additional possibilities for signal generation and operation. In addition, the operating parts may have combined motions with different functionality with a different motion.

The integrated assessment unit 18 also on this occasion processes the signals emitted by the sensors into clear operating pulses for the units to be operated. With this, in a simple case, leftward and rightward movements can be distinguished, along with the processing of complex sequences. An example is the angular velocity at which the operator moves a rotating operating part 2. 1f the rotary movement is fast, the range of values is constricted; in other words, an angular unit is converted with a high difference amount of the value to be adjusted, to obtain the desired value as the operator wishes. In contrast, a low angular velocity is interpreted as the operator wanting to make a fine adjustment, and the value range is correspondingly expanded. An angular unit with a high difference amount of the value to be adjusted is converted.

Operating part 2 can be removed from touch-sensitive display device 1. This involves a number of advantages. Thus, the touch-sensitive display device 1 can easily be cleaned.

In one feature of the invention, operating part 2 further assumes the safety function of a key for certain functions, such a starting the vehicle for example. The function assured by the removable operating part 2 can only be implemented if operating part 2 is in its provided place and is registered there by the sensors 5. In a further embodiment, an additional sensor is used to detect the presence of operating part 2. This embodiment is primarily used when, as described the exemplary example in FIG. 1, the magnet 3 is implemented as a permanent magnet.

In the version of the holding magnet, of magnet 3 as an electromagnet, as described above, after the operating part is removed, the holding voltage is switched off and long-duration energy consumption is avoided thereby. A detector detects operating part 2 being applied again, the holding voltage is again switched on, and operating part 2 is fixed in its position.

In a preferred embodiment, the operating part 16 can be shifted in linear fashion.

Figure 6:
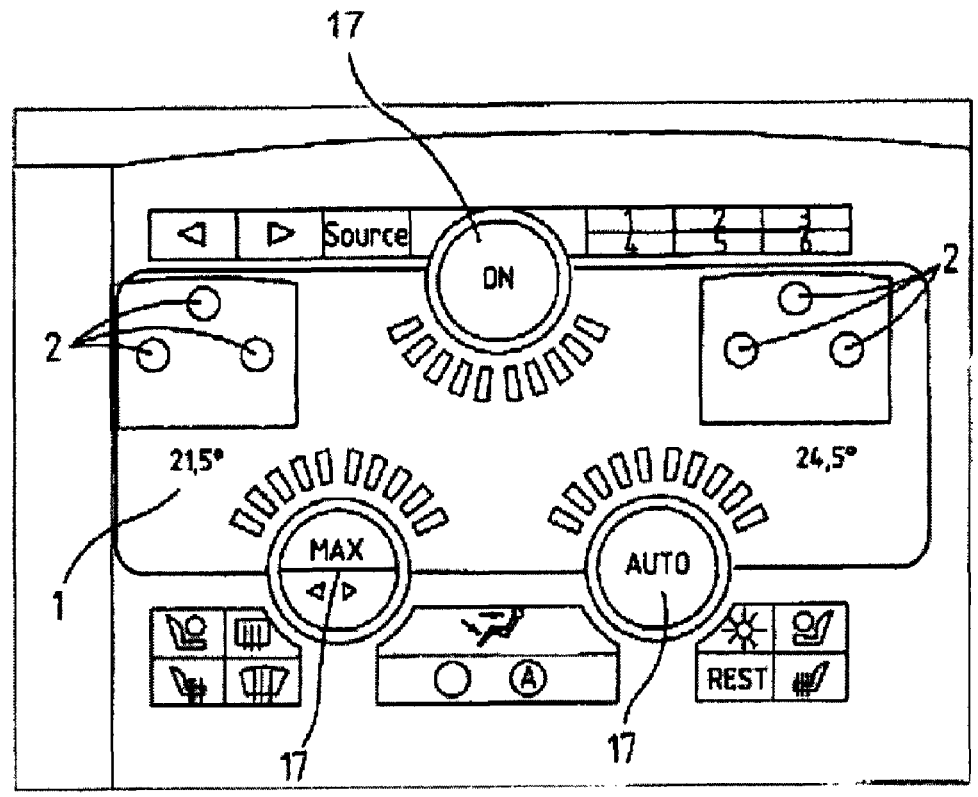
FIG. 6 shows use in the multi-function display device of a motor vehicle.

FIG. 6 shows an example of the present invention in use when operating a motor vehicle. Along with the usual operating parts 17, which are arrayed along the edges, touch-sensitive display device 1 additionally has operating parts 2 attached on the surface, through which additional functions are affected, and facilitated operation is possible.

In a further development of the invention, the arrangement described in FIG. 7 is used. A photo sensor 12 in the center of rotating operating part 2 registers light signals directed from the periphery into the center. As a light-and-shadow pattern on the screen of touch-sensitive display device 1, these can detect a rotary motion and the angle of rotation of operating part 2. In a further form, photosensor 12 is capable of distinguishing light of various colors, as may be generated by the screen of touch-sensitive display device 1, by which the bandwidth of the transmitted information is increased.

In some embodiments, the light signals may be guided from the screen of touch-sensitive display device 1 to the photosensor via a flexible optical waveguide 11, and for example, via prismatic elements as an optical waveguide 1.

Owing to the advantageous further development with a photosensor in the center of the rotating operating part, data transmission to the control unit that follows is simplified, since instead of numerous sensors 5 at the level of the rotating operating part's circumference, only a single sensor is required, which receives the optical signals and transmits them. Photosensor 12, like sensors with other functional principles, is attached or coupled to the underside of touch-sensitive display device 1.

To avoid making an expensive permanent change to the system, as would be necessary if installing a sensor in or on the surface of touch-sensitive display device 1, an appropriate programming may be provided which makes it possible for photosensor 12 to detect the light from the optical waveguide through touch-sensitive display device 1. This can be via the "white" display setting of touch-sensitive display device 1, with the liquid crystals being translucent and allowing light to pass through.

Including a photosensor offers a possibility to switch between the means by which operating part 2 functioning as an absolute sensor and as a relative sensor. With an absolute sensor, the actual physical setting, which may also have changed when not in operation, may be of importance. With a relative sensor, what counts as the starting point is the setting registered when last operated, notwithstanding possible changes in the setting when in a switched-off state.

Since photosensor 12 is placed above the surface of touch-sensitive display device 1, such as, indirectly via optical waveguide 11 for a discrete angular setting of rotating operating part 2, the absolute setting can be reproduced, as long as the signal emitted from the screen of touch-sensitive display device 1 can be assigned unambiguously via photosensor 12 to a place beneath the circumference of operating part 2.

Likewise, alternatively, the absolute setting can remain out of consideration, as the particular starting position when the operating process begins on the rotating operating part, and only the relative rotary angle is consulted in relation to the start of the operating process for determining the value desired by the operator.

What is claimed is:

1. A touch-sensitive display device for motor vehicles comprising:
   a touch sensitive display for motor vehicles;
   a mechanical operating part;
   a holding magnet whereby said operating part is held by magnetic force on the surface of said touch-sensitive display; and
   a sensor element under the surface of said touch-sensitive display, and wherein said sensor element determines the switching positions of the operating part;
   at least two drives capable of moving said mechanical operating part on the surface of said touch sensitive display; and
   wherein said mechanical operating part moves automatically to pre-selected positions on the surface of the touch-sensitive display device with said drives and implements gestural display effects through motions.

2. The touch-sensitive display device of claim 1 wherein said holding magnet (3) is a permanent magnet.

3. The touch-sensitive display device of claim 1, wherein the said holding magnet (3) is an electromagnet.

4. The touch-sensitive display device of claim 1, wherein said mechanical operating part (2) can be removed from the display device (1).

5. The touch-sensitive display device of claim 1, wherein said removable mechanical operating part (2) assumes the safety function of a key.

6. The touch-sensitive display device of claim 1, wherein said mechanical operating part (2) is configured as a push button (14).

7. The touch-sensitive display device of claim 1, wherein said mechanical operating part (2) is configured as a rotating knob.

8. The touch-sensitive display device of claim 1, wherein said mechanical operating part (2) is capable of moving to pre-selected positions on the surface of the touch-sensitive display device (1) and control signals are triggered by the motions.

9. The touch-sensitive display device of claim 1, wherein said mechanical operating part (2) is configured as a slider, capable of sliding along the surface of said touch-sensitive display.

10. The touch-sensitive display device of claim 1, wherein said mechanical operating part (2) is configured as a short-stroke lever, and capable of pivoting about an axis.

11. The touch-sensitive display device of claim 10, wherein said axis is substantially parallel to said touch-sensitive display.

12. The touch-sensitive display device of claim 10, wherein said axis does not pass though said touch-sensitive display.

13. The touch-sensitive display device of claim 1, wherein said motions of the operating part (2) are received by means of an optical system including a photosensor (12) and an optical waveguide (11), and converted into control signals.

* * * * *